United States Patent
Suh et al.

(10) Patent No.: US 10,396,797 B2
(45) Date of Patent: Aug. 27, 2019

(54) RECONFIGURABLE PROCESSOR AND OPERATION METHOD THEREFOR

(71) Applicant: Samsung Electronics Co., Ltd., Suwon-si, Gyeonggi-do (KR)

(72) Inventors: Dong-kwan Suh, Yongin-si (KR); Ki-seok Kwon, Suwon-si (KR); Young-hwan Park, Yongin-si (KR); Seung-won Lee, Hwaseong-si (KR); Suk-jin Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 99 days.

(21) Appl. No.: 15/520,294

(22) PCT Filed: Oct. 19, 2015

(86) PCT No.: PCT/KR2015/011053
§ 371 (c)(1),
(2) Date: Apr. 19, 2017

(87) PCT Pub. No.: WO2016/064158
PCT Pub. Date: Apr. 28, 2016

(65) Prior Publication Data
US 2017/0317679 A1    Nov. 2, 2017

(30) Foreign Application Priority Data
Oct. 21, 2014  (KR) .......... 10-2014-0142780

(51) Int. Cl.
*G06F 9/38* (2018.01)
*G06F 15/76* (2006.01)
*G06F 15/173* (2006.01)
*H03K 19/177* (2006.01)

(52) U.S. Cl.
CPC ......... *H03K 19/17752* (2013.01); *G06F 9/38* (2013.01); *G06F 15/17375* (2013.01); *G06F 2015/768* (2013.01)

(58) Field of Classification Search
None
See application file for complete search history.

(56) References Cited

U.S. PATENT DOCUMENTS

| 7,478,227 B2 * | 1/2009 | Ryu ........................ G06F 9/381 |
| | | 712/241 |
| 8,276,120 B2 | 9/2012 | De Sousa et al. |
| 8,468,547 B2 | 6/2013 | Lefebvre et al. |

(Continued)

FOREIGN PATENT DOCUMENTS

| KR | 10-2005-0123163 A | 12/2005 |
| KR | 10-2009-0045026 A | 5/2009 |

(Continued)

*Primary Examiner* — Michael D. Yarry
(74) *Attorney, Agent, or Firm* — Jefferson IP Law, LLP

(57) ABSTRACT

Provided are a reconfigurable processor and a method of operating the same, the reconfigurable processor including: a configurable memory configured to receive a task execution instruction from a control processor; and a plurality of reconfigurable arrays, each configured to receive configuration information from the configurable memory, wherein each of the plurality of reconfigurable arrays simultaneously executes a task based on the configuration information.

15 Claims, 8 Drawing Sheets

(56) References Cited

U.S. PATENT DOCUMENTS

| | | | |
|---|---|---|---|
| 2006/0212678 A1 | 9/2006 | De Oliveira | |
| 2006/0225139 A1* | 10/2006 | Takada | G06F 15/7867 726/27 |
| 2007/0168718 A1* | 7/2007 | Reblewski | H03K 19/1776 714/15 |
| 2010/0235554 A1* | 9/2010 | Chang | G06F 13/385 710/104 |
| 2010/0268862 A1 | 10/2010 | Park et al. | |
| 2012/0089792 A1 | 4/2012 | Fahs et al. | |
| 2012/0233445 A1 | 9/2012 | Zhang | |
| 2013/0080739 A1 | 3/2013 | Kyo | |

FOREIGN PATENT DOCUMENTS

| KR | 10-2010-0115578 A | 10/2010 |
|---|---|---|
| KR | 10-2013-0089524 A | 8/2013 |
| KR | 10-1293701 B1 | 8/2013 |

* cited by examiner

RECONFIGURABLE PROCESSOR AND OPERATION METHOD THEREFOR

TECHNICAL FIELD

The present invention relates to a reconfigurable processor and a method of operating the reconfigurable processor and, more particularly, to a method by which a reconfigurable processor including a configurable memory and a plurality of reconfigurable arrays processes bulk data.

BACKGROUND ART

Latest processors have been designed so as to be able to maximize the performance in an application in which bulk data should be processed. Examples of a method of increasing the performance of a processor include a method of increasing a number of instructions which can be simultaneously processed by instruction level parallelism (ILP), a method of increasing a number of pieces of data which can be simultaneously processed by data level parallelism (DLP), and a method of simultaneously processing a plurality of threads by thread level parallelism (TLP). A process to be applied to these methods may be a reconfigurable processor.

The reconfigurable processor is a processor capable of changing and reconfiguring, to a software configuration, a hardware configuration of a computing device for performing computation. The reconfigurable processor may satisfy both the advantage of hardware having a fast computation speed and the advantage of software having a good diversity of computations.

DETAILED DESCRIPTION OF THE INVENTION

Technical Problem

Provided are a reconfigurable processor including a configurable memory and a plurality of reconfigurable arrays to process bulk data and a method of operating the same. In addition, provided is a computer-readable recording medium having recorded thereon a program for executing the method in a computer. The technical problems to be solved by the present embodiments are not limited thereto, and other technical problems may be inferred from the embodiments below.

Technical Solution

According to a first aspect, a reconfigurable processor includes: a configurable memory configured to receive a task execution instruction from a control processor; and a plurality of reconfigurable arrays, each configured to receive configuration information from the configurable memory based on the received instruction, wherein each of the plurality of reconfigurable arrays simultaneously executes a task, based on the configuration information, by using a plurality of function units included in each of the plurality of reconfigurable arrays.

The control processor may include a plurality of controllers, and the reconfigurable processor may further include a start synchronizer configured to determine whether the configurable memory has received all of a plurality of task execution instructions respectively from the plurality of controllers.

If the configurable memory has received all of the plurality of task execution instructions as a result of the determination, the configuration information may be transmitted to each of the plurality of reconfigurable arrays.

The reconfigurable processor may further include an array synchronizer configured to stop transmitting the configuration information to each of the plurality of reconfigurable arrays until all of the plurality of reconfigurable arrays acquire specific data, when each of the plurality of reconfigurable arrays accesses an external shared data memory to acquire the specific data.

The array synchronizer may resume the transmission of the configuration information when all of the plurality of reconfigurable arrays have acquired the specific data.

Each of the plurality of reconfigurable arrays may be a coarse grained array (CGA) configured by connecting the plurality of function units to each other.

The configuration information may include information for reconfiguring the plurality of function units.

Each of the plurality of reconfigurable arrays may include a register file, and the information for the reconfiguration may include information about a connection configuration between the plurality of function units, information about a connection configuration between any one of the plurality of function units and the register file, and information about a connection configuration between any one of the plurality of function units and an external shared resource.

Each of the plurality of function units may execute a scalar operation or a vector operation.

The control processor may execute the task by directly controlling a resource included in any one of the plurality of reconfigurable arrays.

According to a second aspect, a method of operating a reconfigurable processor includes: receiving, by a configurable memory included in the reconfigurable processor, a task execution instruction from a control processor; transmitting, based on the received instruction, configuration information in the configurable memory to each of a plurality of reconfigurable arrays included in the reconfigurable processor; and simultaneously executing, by each of the plurality of reconfigurable arrays, a task by using a plurality of function units included in each of the plurality of reconfigurable arrays, based on the configuration information.

According to a third aspect, provided is a computer-readable recording medium having recorded thereon a program for implementing a method of operating a reconfigurable processor.

Advantageous Effects of the Invention

Since a reconfigurable processor includes a configurable memory and a plurality of reconfigurable arrays, the most effective processor in terms of the area/performance/power for processing bulk data is provided.

BEST MODE

According to a first aspect, a reconfigurable processor includes: a configurable memory configured to receive a task execution instruction from a control processor; and a plurality of reconfigurable arrays, each configured to receive configuration information from the configurable memory based on the received instruction, wherein each of the plurality of reconfigurable arrays simultaneously executes a task, based on the configuration information, by using a plurality of function units included in each of the plurality of reconfigurable arrays.

According to a second aspect, a method of operating a reconfigurable processor includes: receiving, by a configurable memory included in the reconfigurable processor, a task execution instruction from a control processor; transmitting, based on the received instruction, configuration information in the configurable memory to each of a plurality of reconfigurable arrays included in the reconfigurable processor; and simultaneously executing, by each of the plurality of reconfigurable arrays, a task by using a plurality of function units included in each of the plurality of reconfigurable arrays, based on the configuration information.

According to a third aspect, provided is a computer-readable recording medium having recorded thereon a program for implementing a method of operating a reconfigurable processor.

MODE OF THE INVENTION

Hereinafter, the invention will be described in detail by embodiments only for illustration with reference to the accompanying drawings. The embodiments described below are only to specify the invention and not to restrict or limit the right scope of the invention. It is analyzed that the matters which could be readily inferred by those of ordinary skill in the art to which the invention belongs from the detailed description and the embodiments belong to the right scope of the invention.

The term "consist of", "include", or the like used in the present specification should not be analyzed to necessarily include all of a plurality of components or operations described in the specification, and it should be analyzed that some of the plurality of components or operations may not be included or additional components or operations may be further included.

Although terms including an ordinal number, such as 'first' or 'second', used in the present specification can be used to describe various elements, the elements cannot be limited by the terms. The terms can be used to classify a certain element from another element.

The term "a plurality of" used in the present specification indicates two or more and is not limited to a specific number. In addition, the meaning of both singular and plural may be applied to a component without the term "a plurality of".

Hereinafter, the embodiments of the present invention will be described in detail with reference to the drawings.

Figure 1:
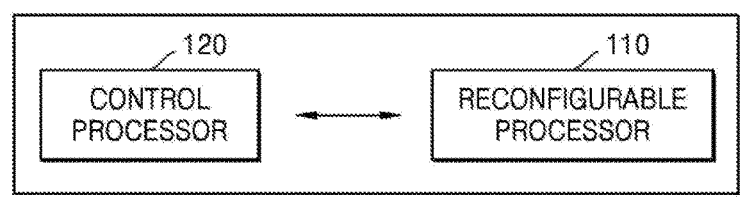
FIG. 1 is a block diagram for describing a control system including a reconfigurable processor, according to an embodiment.

FIG. 1 is a block diagram for describing a control system 100 including a reconfigurable processor 110, according to an embodiment.

Referring to FIG. 1, the control system 100 may include the reconfigurable processor 110 and a control processor 120, according to an embodiment.

Only components related to the present embodiment are shown in the control system 100 shown in FIG. 1. Therefore, it may be understood by those of ordinary skill in the art related to the present embodiment that other general-use components besides the components shown in FIG. 1 can be further included.

Examples of the reconfigurable processor 110 may include a very long instruction word (VLIW), a superscalar, and a coarse grained array (CGA). These processors enhance the performance through simultaneously executable instructions with a plurality of function units. The superscalar includes hardware configured to seek simultaneously executable instructions. Therefore, the hardware is complicated. However, the VLIW and the CGA predefine and execute simultaneously executable instructions by using a compiler technique. Particularly, the CGA may exhibit excellent performance when computing a loop part in which the same operation is iteratively performed. The reconfigurable processor 110 may exhibit better performance when combined with a pipeline technique of starting one operation and then continuously executing a next operation in an overlapping manner. By doing this, a plurality of instructions may be quickly executed.

According to an embodiment, the reconfigurable processor 110 may include a reconfigurable array. The reconfigurable array may indicate an array form configured with a plurality of function units capable of performing a plurality of operations. The reconfigurable processor 110 may parallel process a plurality of instructions through the reconfigurable array. The reconfigurable array may be a CGA.

The control processor 120 may operate the reconfigurable processor 110 by transmitting a task execution instruction thereto. In detail, the control processor 120 may transmit the task execution instruction to a configuration memory included in the reconfigurable processor 110, and the configuration memory may execute a task through the reconfigurable array based on configuration information. As described above, since the control processor 120 may operate the reconfigurable processor 110 by transmitting a task execution instruction thereto, it can be considered that the control processor 120 and the reconfigurable processor 110 are indirectly coupled. An operation of the reconfigurable processor 110 through this indirect coupling may be an operation in a CGA mode. This will be described in more detail with reference to FIG. 2.

In addition, the control processor 120 may execute a task by sharing resources in the reconfigurable processor 110. In detail, the control processor 120 may directly execute a task by using some function units and a register file of the reconfigurable processor 110. As described above, since the control processor 120 may operate the reconfigurable processor 110 by sharing resources in the reconfigurable processor 110, it can be considered that the control processor 120 and the reconfigurable processor 110 are directly coupled. An operation of the reconfigurable processor 110 through this direct coupling may be an operation in a VLIW mode. This will be described in more detail with reference to FIG. 2.

Figure 2:
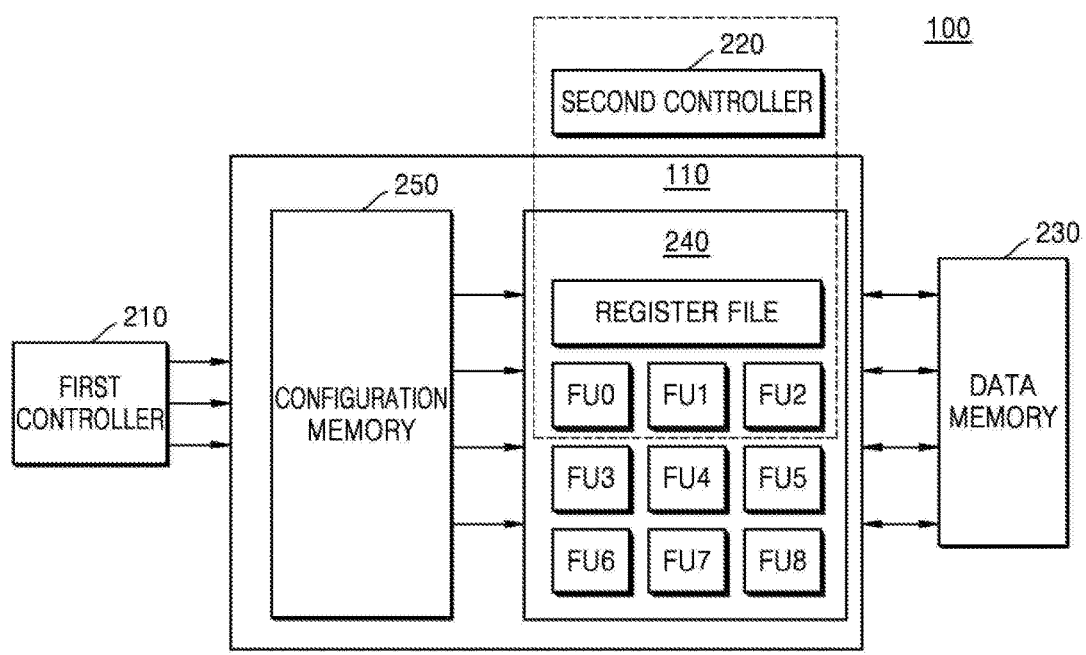
FIG. 2 is a block diagram for describing the control system of FIG. 1, according to another embodiment.

FIG. 2 is a block diagram for describing the control system 100 of FIG. 1, according to another embodiment.

Referring to FIG. 2, the control system 100 may include a first controller 210, a second controller 220, the reconfigurable processor 110, and a data memory 230.

According to an embodiment, the reconfigurable processor 110 may include a reconfigurable array 240 and a configuration memory 250.

The reconfigurable array 240 may include a plurality of function units (hereinafter, FUs). Each FU may independently process a task or instruction. According to an embodiment, the reconfigurable array 240 may parallel process a predetermined task by using the plurality of FUs operating independently. The plurality of FUs may include an arithmetic logic unit, a multiplier, a load/store unit, or a local register file and may have a plurality of inputs and outputs to access the units or files described above. A plurality of accessible input and output paths may be provided between the plurality of FUs, and a multiplexer configured to set the plurality of paths between the plurality of FUs may be provided. An output of the multiplexer may be selected according to configuration information in the configuration memory 250, and an entire configuration of the reconfigurable array 240 may be set according to the configuration information in the configurable memory 250. In addition, according to an embodiment, the reconfigurable array 240 may be a CGA.

In addition, each of the plurality of FUs may execute a scalar-type operation and a vector-type operation. Therefore, the reconfigurable processor 110 may process a plurality of pieces of data with a same instruction.

The reconfigurable array 240 may include a register file. The register file may provide data required for the plurality of FUs to process an instruction. In addition, the register file may store a result obtained by processing the instruction by the plurality of FUs. The register file may be a local register file in which the plurality of FUs temporarily store data during an operation or a shared register file through which data is given and taken between the second controller 220 and some of the plurality of FUs. A detailed description of the shared register file will be made below. In addition, although it is shown in FIG. 2 that the register file is included in the reconfigurable array 240, the register file may be outside the reconfigurable array 240, and a plurality of register files may be provided.

The configuration memory 250 stores configuration information of the reconfigurable array 240. The configuration information may include instruction information to be allocated to each FU of the reconfigurable array 240 or information about a connection state between the plurality of FUs. Therefore, an instruction mapped to each FU and the connection state between the plurality of FUs may vary depending on the configuration information stored in the configuration memory 250.

For example, according to first configuration information, an instruction A may be mapped to an FU0, and an output of the FU0 may be connected to an input of an FU4. In addition, according to second configuration information, an instruction B may be mapped to the FU0, and the output of the FU0 may be connected to an input of an FU5. That is, the reconfigurable processor 110 may control a configuration of the reconfigurable array 240 so as to be optimized to a specific task according to the configuration information in the configuration memory 250.

In addition, the configuration information in the configuration memory 250 may include information about a connection state between the plurality of FUs and the register file, information about a connection state between the plurality of FUs and the data memory 230, and information about a connection state between the plurality of FUs and an external node (not shown). The external node may store a specific constant value, wherein when the plurality of FUs require the specific constant value, the plurality of FUs may acquire the specific constant value by accessing the external node based on the configuration information.

The data memory 230 stores data required to execute a task or an instruction and data which is not shared in the register file. The data memory 230 transmits necessary data to the reconfigurable processor 110 by a load/store operation.

According to an embodiment, the control processor 120 may include the first controller 210 and the second controller 220.

The first controller 210 may transmit a task execution instruction to the configuration memory 250 of the reconfigurable processor 110. Accordingly, the reconfigurable array 240 may execute a task according to the configuration information in the configuration memory 250. According to an embodiment, the reconfigurable processor 110 may be indirectly coupled to the first controller 210 to perform the task in the CGA mode.

According to an embodiment, the task executed in the CGA mode indicates a loop task in which an iterative execution is required. Therefore, in the CGA mode, optimal configuration information for each loop is required according to the contents of each loop, and the plurality of FUs of the reconfigurable array 240 perform a task according to the configuration information.

The second controller 220 may directly control the register file and some FUs of the reconfigurable array 240. That is, the second controller 220 may share some resources with the reconfigurable processor 110. According to an embodiment, the reconfigurable processor 110 may be directly coupled to the second controller 220 to execute a task in the VLIW mode.

According to an embodiment, the task executed in the VLIW mode may be parallel executed by respectively distributing a plurality of instructions input to the reconfigurable processor 110 to the plurality of FUs. Therefore, a number of instructions simultaneously executable in the VLIW mode may be determined by a number of FUs included in the VLIW mode.

Figure 3:
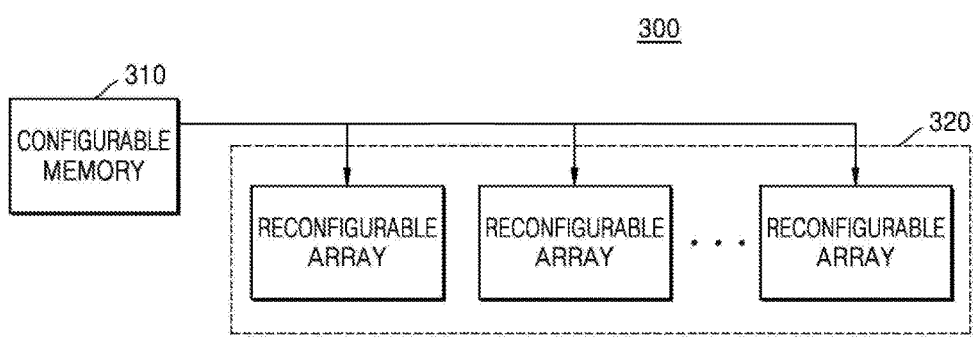
FIG. 3 is a block diagram for describing a reconfigurable processor according to another embodiment.

FIG. 3 is a block diagram for describing a reconfigurable processor 300 according to another embodiment.

The reconfigurable processor 300 may include a configurable memory 310 and a plurality of reconfigurable arrays 320, each receiving configuration information in the configurable memory 310.

Only components related to the present embodiment are shown in the configurable memory 310 shown in FIG. 3. Therefore, it may be understood by those of ordinary skill in the art related to the present embodiment that other general-use components besides the components shown in FIG. 3 can be further included.

Each of the plurality of reconfigurable arrays 320 may include a plurality of FUs, and each of the plurality of FUs may independently process a task or instruction. According to an embodiment, each of the plurality of reconfigurable arrays 320 may parallel process a predetermined task by using the plurality of FUs operating independently. The plurality of FUs may include an arithmetic logic unit, a multiplier, a load/store unit, or a local register file and may have a plurality of inputs and outputs to access the units or files described above. A plurality of accessible input and output paths may be provided between the plurality of FUs, and a multiplexer configured to set the plurality of paths between the plurality of FUs may be provided. An output of the multiplexer may be selected according to configuration information in the configurable memory 310, and a configuration of each of the plurality of reconfigurable arrays 320 may be set according to the configuration information in the configurable memory 310. In addition, according to an embodiment, each of the plurality of reconfigurable arrays 320 may be a CGA.

In addition, each of the plurality of FUs may execute a scalar-type operation and a vector-type operation. Therefore, the reconfigurable processor 300 may process a plurality of pieces of data with a same instruction.

The configurable memory 310 stores configuration information of the plurality of reconfigurable arrays 320. The configuration information may include instruction information to be allocated to each FU or information about a connection state between the plurality of FUs. Therefore, an instruction mapped to each FU and the connection state between the plurality of FUs may vary depending on the configuration information stored in the configurable memory 310.

According to an embodiment, in the reconfigurable processor 300, the plurality of reconfigurable arrays 320 may share the configurable memory 310 such that the plurality of reconfigurable arrays 320 parallel process data at the same time through a single piece of configuration information. Therefore, each of the plurality of reconfigurable arrays 320 may be the same reconfigurable array.

According to an embodiment, since the plurality of reconfigurable arrays 320 parallel process data at the same time through the configuration information in the configurable memory 310, the present embodiment may be advantageous for a task of processing bulk data. For example, examples of the task of processing bulk data may be various digital image signal processing techniques by which an image device provides image quality close to a natural image. More specific examples of image signal processing may include image processing for motion optimization by which noise generated from continuous frames is cancelled, image processing for contrast enhancement by which contrast and brightness are more naturalized, image processing for detail enhancement, and image processing for color optimization matched with natural colors.

According to an embodiment, when the digital image signal processing described above is applied to a random display screen, the reconfigurable processor 300 may be used. In detail, the random display screen may be divided into a plurality of regions, and the plurality of reconfigurable arrays 320 may correspond to the plurality of regions, respectively. In this case, the same image signal processing process is applied to each of the plurality of regions, and thus each of the plurality of reconfigurable arrays 320 may receive configuration information of the image signal processing from the configurable memory 310. Therefore, the plurality of reconfigurable arrays 320 may process image signal processing on the plurality of regions, respectively.

As described above, the reconfigurable processor 300 may allow the plurality of reconfigurable arrays 320 to parallel process data at the same time through the configuration information in the configurable memory 310, the reconfigurable processor 300 may be the most effective process in terms of the area, performance/power.

Figure 4:
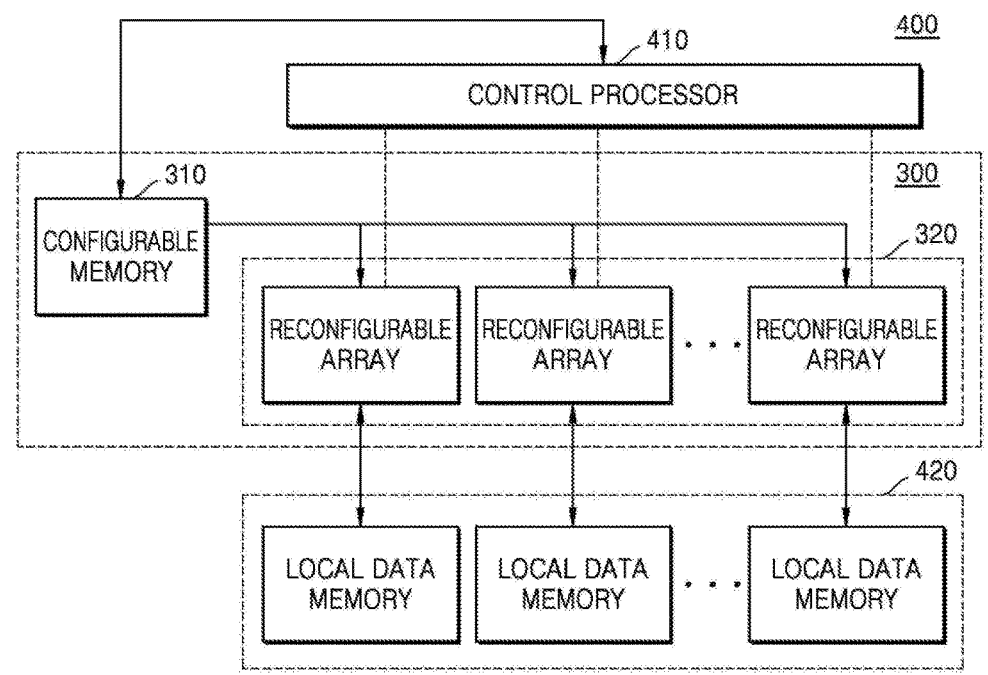
FIG. 4 is a block diagram for describing a control system including the reconfigurable processor of FIG. 3.

FIG. 4 is a block diagram for describing a control system 400 including the reconfigurable processor 300 of FIG. 3.

The reconfigurable processor 300 may receive a task execution instruction through a control processor 410. In more detail, the configurable memory 310 may receive the task execution instruction of the control processor 410. The configurable memory 310 may transmit configuration information of a corresponding task to each of the plurality of reconfigurable arrays 320 based on the received task execution instruction. Each of the plurality of reconfigurable arrays 320 may simultaneously execute the task by using a plurality of FUs included in each of the plurality of reconfigurable arrays 320, based on the received configuration information.

According to an embodiment, the plurality of reconfigurable arrays 320 may receive data required to execute the task from a plurality of local data memories 420, respectively. Therefore, the plurality of reconfigurable arrays 320 may execute the task by receiving data allocated from the plurality of local data memories 420, respectively.

According to an embodiment, the control processor 410 may transmit a task execution instruction to the configurable memory 310 such that the reconfigurable processor 300 executes a task, but the control processor 410 may be directly coupled to each of the plurality of reconfigurable arrays 320 to execute the task. That is, as shown with the dotted lines connecting the control processor 410 and the plurality of reconfigurable arrays 320 in FIG. 4, the control processor 410 may execute the task by sharing resources, such as an FU or a register file, included in each of the plurality of reconfigurable arrays 320.

Each of the plurality of local data memories 420 stores data required for the plurality of reconfigurable arrays 320 to execute a task or instruction and data which is not shared in the register file. Each of the plurality of local data memories 420 transmits required data to the reconfigurable processor 300 by a load/store operation.

Figure 5:
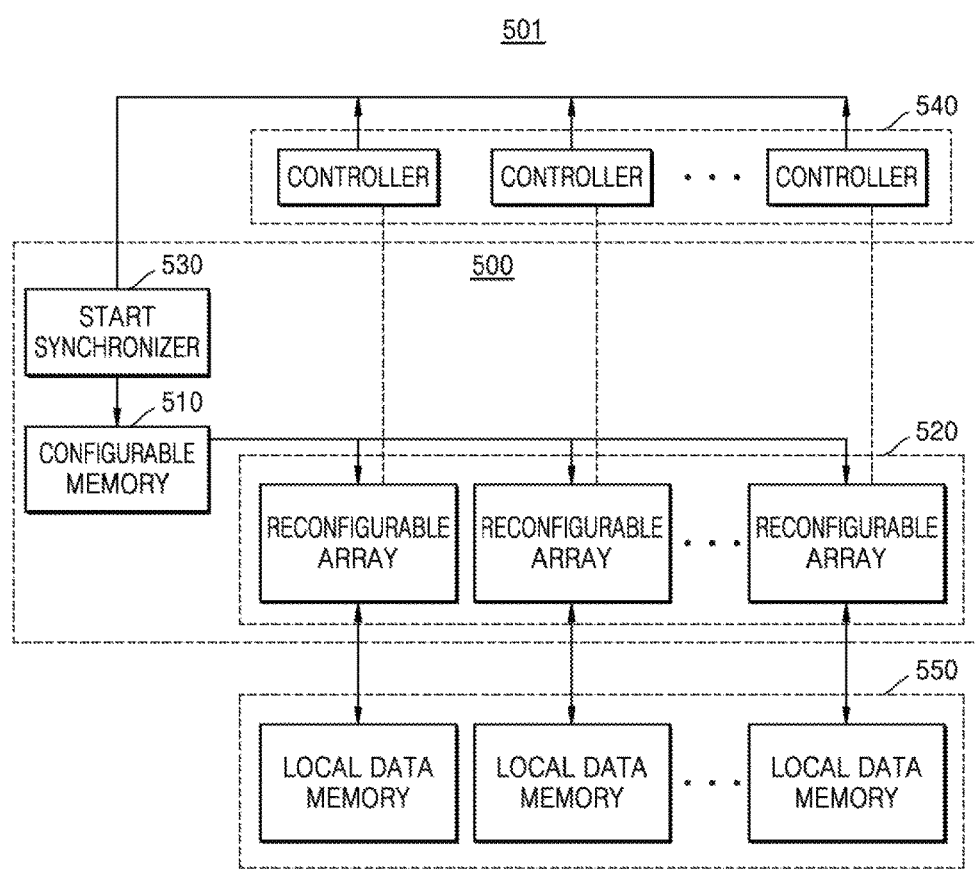
FIG. 5 is a block diagram for describing a reconfigurable processor including a start synchronizer and a control system including the reconfigurable processor, according to an embodiment.

FIG. 5 is a block diagram for describing a reconfigurable processor 500 including a start synchronizer 530 and a control system 501 including the reconfigurable processor 500, according to an embodiment.

A configurable memory 510 and each of a plurality of reconfigurable arrays 520 of the reconfigurable processor 500 are the same as described with reference to FIG. 3. In addition, each of a plurality of local data memories 420 is the same as described with reference to FIG. 4.

According to an embodiment, a role of the control processor 410 of FIG. 4 may be performed by a plurality of controllers 540 in FIG. 5, and the plurality of controllers 540 may correspond to the plurality of reconfigurable arrays 520, respectively. Therefore, the configurable memory 510 may receive a task execution instruction from each of the plurality of controllers 540.

According to an embodiment, only when the configurable memory 510 completely receives a task execution instruction from each of the plurality of controllers 540, the configurable memory 510 may transmit configuration information to each of the plurality of reconfigurable arrays 520. Therefore, the reconfigurable processor 500 may include the start synchronizer 530 such that the start synchronizer 530 receives a task execution instruction from each of the plurality of controllers 540. According to an embodiment, when the start synchronizer 530 completely receives a task execution instruction from each of the plurality of controllers 540, the start synchronizer 530 may transmit the received task execution instructions to the configurable memory 510. Accordingly, the configurable memory 510 may transmit configuration information to each of the plurality of reconfigurable arrays 520.

According to another embodiment, the start synchronizer 530 may be included in the configurable memory 510. Therefore, the start synchronizer 530 may determine whether the configurable memory 510 has received all task execution instructions. In this case, if the start synchronizer 530 determines whether the configurable memory 510 has received all the task execution instructions, the configurable memory 510 may transmit configuration information to each of the plurality of reconfigurable arrays 520.

According to an embodiment, each of the plurality of controllers 540 may transmit a task execution instruction to the configurable memory 510 such that the plurality of reconfigurable arrays 520 execute a task, but the plurality of controllers 540 may be respectively coupled to the plurality of corresponding reconfigurable arrays 520 such that the plurality of reconfigurable arrays 520 execute a task. That is, for example, as shown with the dotted lines respectively connecting the plurality of controllers 540 and the plurality of reconfigurable arrays 520 in FIG. 5, the plurality of controllers 540 may execute the task by sharing resources, such as FUs or register files, included in the plurality of reconfigurable arrays 520, respectively.

According to an embodiment, when the digital image signal processing described above is applied to a random display screen, the control system 501 may be used. In detail, the random display screen may be divided into a plurality of regions, and the plurality of controllers 540 may have right of a task related to the image signal processing on the plurality of regions, respectively. In this case, each of the plurality of controllers 540 transmits a task execution instruction for the image signal processing to the configurable memory 510, and when the configurable memory 510 receives all task execution instructions through the start synchronizer 530, each of the plurality of reconfigurable arrays 520 may receive configuration information for the image signal processing from the same image signal processing process is applied to each of the plurality of regions, and thus each of the plurality of reconfigurable arrays 520 may receive configuration information of the image signal processing from the configurable memory 510. Therefore, the plurality of reconfigurable arrays 520 may acquire data for the plurality of regions from a plurality of local data memories 550, respectively, and execute a task for the image signal processing on the plurality of regions by using the acquired data, respectively.

According to an embodiment, when each of the plurality of reconfigurable arrays 520 completely executes the task, results of the task executions may be respectively stored in the plurality of local data memories 550 or transmitted to and stored in an external memory (not shown).

Figure 6:
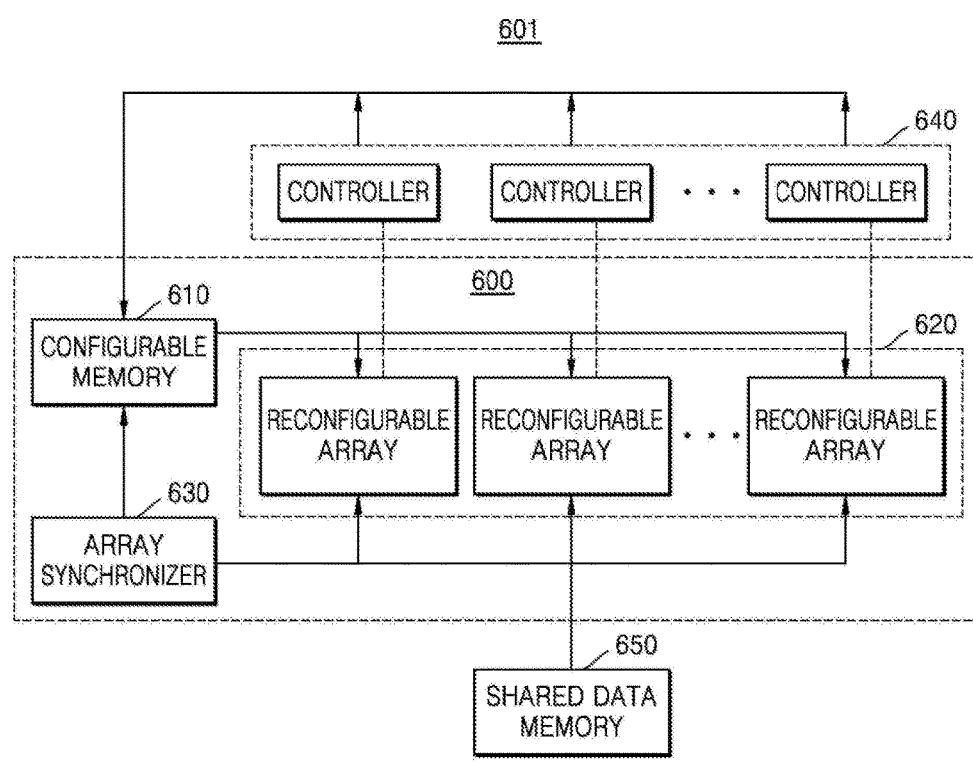
FIG. 6 is a block diagram for describing a reconfigurable processor including an array synchronizer and a control system including the reconfigurable processor, according to an embodiment.

FIG. 6 is a block diagram for describing a reconfigurable processor 600 including an array synchronizer 630 and a control system 601 including the reconfigurable processor 600, according to an embodiment.

A configurable memory 610 and each of a plurality of reconfigurable arrays 620 of the reconfigurable processor 600 are the same as described with reference to FIG. 3. In addition, a plurality of controllers 640 are the same as described with reference to FIG. 5.

According to an embodiment, each of the plurality of reconfigurable arrays 620 may receive configuration information in the configurable memory 610 and execute a task according to the received configuration information. Since each of the plurality of reconfigurable arrays 620 requires specific data in a shared data memory 650 while executing the task, each of the plurality of reconfigurable arrays 620 may access the shared data memory 650 to acquire the specific data.

According to an embodiment, when each of the plurality of reconfigurable arrays 620 cannot acquire the specific data by simultaneously accessing the shared data memory 650, each of the plurality of reconfigurable arrays 620 has to sequentially access the shared data memory 650 to acquire the specific data. Accordingly, until all of the plurality of reconfigurable arrays 620 acquire the specific data, reconfigurable arrays which have acquired the specific data have to stop task execution and wait. Therefore, until all of the plurality of reconfigurable arrays 620 acquire the specific data, the configurable memory 610 has to stop transmitting the configuration information. Since the transmission of the configuration information from the configurable memory 610 is stopped, all of the plurality of reconfigurable arrays 620 stop the task execution.

According to an embodiment, the reconfigurable processor 600 may include the array synchronizer 630 such that the array synchronizer 630 stops transmission of the configuration information in the configurable memory 610 until all of the plurality of reconfigurable arrays 620 acquire the specific data from the shared data memory 650. That is, the array synchronizer 630 may transmit, to the configurable memory 610, a signal for stopping the transmission of the configuration information. Therefore, when all of the plurality of reconfigurable arrays 620 have acquired the specific data from the shared data memory 650, the configurable memory 610 does not receive the stop signal from the array synchronizer 630 anymore, and thus the configurable memory 610 may resume the transmission of the configuration information.

According to another embodiment, the array synchronizer 630 may be included in the configurable memory 610. Therefore, the array synchronizer 630 may determine whether all of the plurality of reconfigurable arrays 620 have acquired the specific data from the shared data memory 650. In this case, the array synchronizer 630 may stop the transmission of the configuration information until all of the plurality of reconfigurable arrays 620 acquire the specific data, and resume the transmission of the configuration information in the configurable memory 610 when all of the plurality of reconfigurable arrays 620 have acquired the specific data.

In addition, the reconfigurable processor 600 may include the start synchronizer 530 of FIG. 5 such that the start synchronizer 530 transmits the configuration information when all task execution instructions are received from the plurality of controllers 640.

Figure 7:
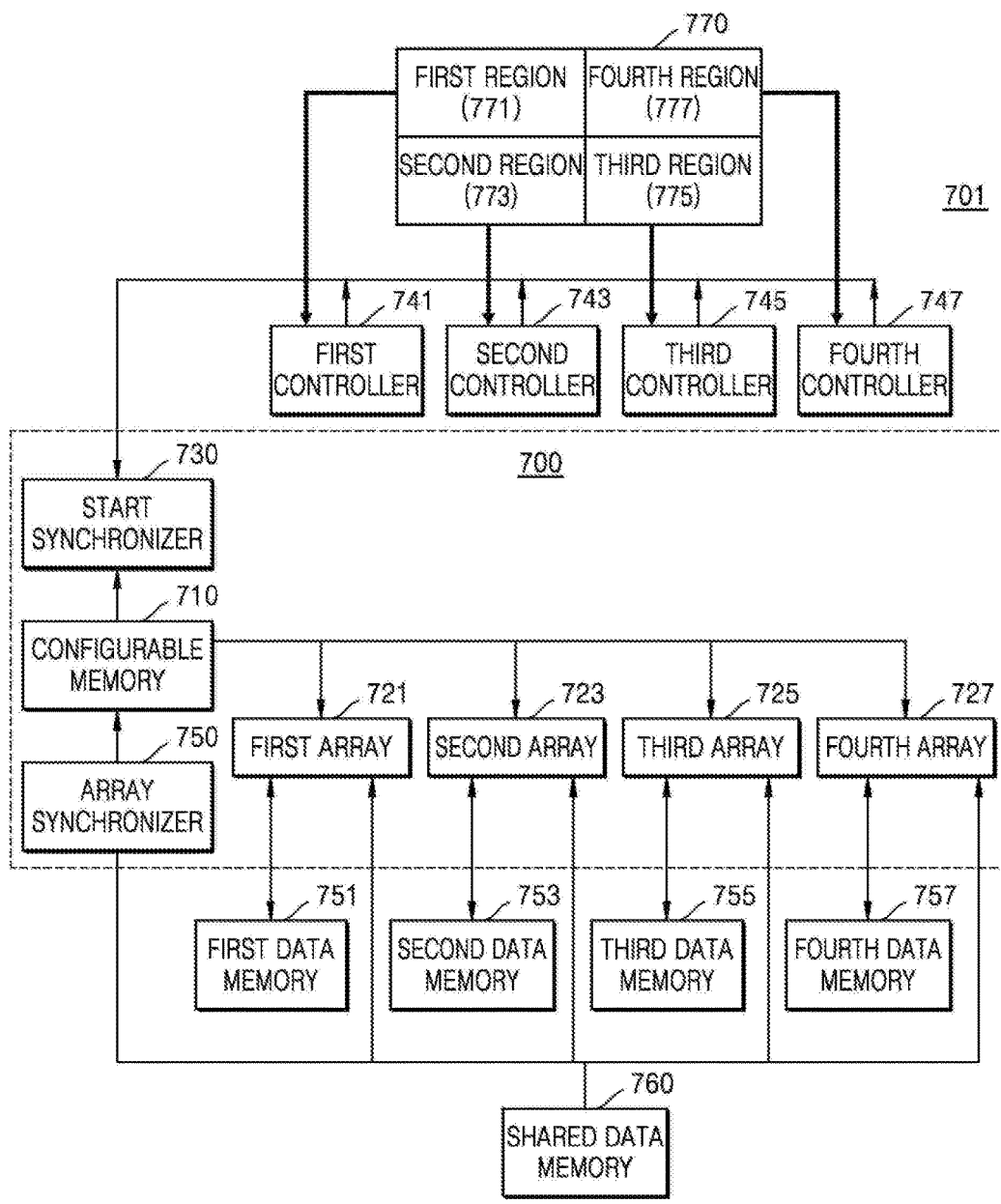
FIG. 7 is a block diagram for describing an example in which a reconfigurable processor executes an image processing task on a display area in a control system, according to an embodiment.

FIG. 7 is a block diagram for describing an example in which a reconfigurable processor 700 executes an image processing task on a display area 770 in a control system 701, according to an embodiment.

The image processing in the present embodiment may be considered as the image signal processing described above and may be applied to other cases where bulk data has to be processed.

A configurable memory 710 and first, second, third, and fourth arrays 721, 723, 725, and 727 are the same as the configurable memory 310 and the plurality of reconfigurable arrays 320 of FIG. 3, respectively, a start synchronizer 730 is the same as the start synchronizer 530 of FIG. 5, and an array synchronizer 750 is the same as the array synchronizer 630 of FIG. 6. The numbers of arrays, controllers, and data memories are not limited to 4 and may vary to different numbers.

The display area 770 may be divided into four regions, a first region 771, a second region 773, a third region 775, and a fourth region 777 as shown in FIG. 7. Therefore, a first controller 741, a second controller 743, a third controller 745, and a fourth controller 747 may have an image processing task execution right on the first region 771, the second region 773, the third region 775, and the fourth region 777, respectively.

Each controller may transmit an image processing task execution instruction on each region to the configurable memory 710. In this case, the start synchronizer 730 may determine whether all the controllers 741, 743, 745, and 747 have transmitted task execution instructions to the configurable memory 710, and if the start synchronizer 730 determines that all the controllers have transmitted task execution instructions to the configurable memory 710, the configurable memory 710 may transmit configuration information of an image processing task to each array.

Each array executes the image processing task according to the configuration information in the configurable memory 710. In addition, each array may execute the task by acquiring, from each data memory, data required to execute the image processing task. In detail, according to an embodiment, the first array 721 may execute the task by acquiring data from a first data memory 751 for the image processing task on the first region 771, the second array 723 may execute the task by acquiring data from a second data memory 753 for the image processing task on the second region 773, the third array 725 may execute the task by acquiring data from a third data memory 755 for the image processing task on the third region 775, and the fourth array 727 may execute the task by acquiring data from a fourth data memory 757 for the image processing task on the fourth region 777, According to an embodiment, each array may require specific data in a shared data memory 760 in the outside while executing the image processing task on each region. In this case, each array may access the shared data memory 760 to acquire the specific data. However, when all the arrays cannot acquire the specific data by simultaneously accessing the shared data memory 760, each array has to sequentially access the shared data memory 760 to acquire the specific data. In this case, the array synchronizer 750 may stop transmitting the configuration information in the configurable memory 710 until all the arrays acquire the specific data. According to an embodiment, until the first array 721 acquires the specific data by accessing the shared data memory 760, the second, third, and fourth arrays 723, 725, and 727 have to stop the task execution, and thus the array synchronizer 750 may stop transmitting the configuration information. Therefore, after all the arrays acquire the specific data, the configurable memory 710 may transmit the configuration information to each array such that each array resumes the task execution.

When the image processing task executions of all the arrays are completed, results of the task executions may be respectively stored in respective data memories or transmitted to and stored in an external memory (not shown).

The description made above about reconfigurable processors and control systems is also applied to a method of operating a reconfigurable processor, which is to be described below.

Figure 8:
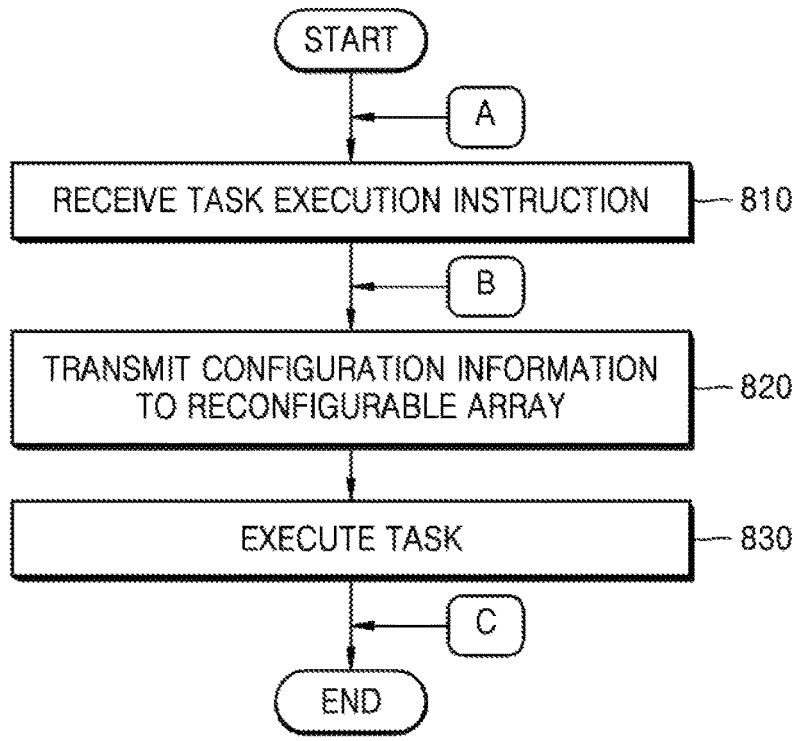
FIG. 8 is a flowchart for describing a method of operating a reconfigurable processor, according to an embodiment.

FIG. 8 is a flowchart for describing a method of operating the reconfigurable processor 300 of FIG. 4. According to an embodiment, the reconfigurable processor 300 to be described below may be the reconfigurable processor 500 of FIG. 5, the reconfigurable processor 600 of FIG. 6, and the reconfigurable processor 700 of FIG. 7.

In operation 810, the reconfigurable processor 300 may receive a task execution instruction from a control processor. In more detail, a configuration memory included in the reconfigurable processor 300 may receive the task execution instruction from the control processor. According to an embodiment, when the control processor includes a plurality of controllers, the reconfigurable processor 300 may receive a task execution instruction from each of the plurality of controllers.

In operation 820, when the reconfigurable processor 300 receives the task execution instruction, the reconfigurable processor 300 may transmit configuration information in a configurable memory to each of a plurality of reconfigurable arrays included in the reconfigurable processor 300.

The configuration information may include instruction information to be allocated or information about a connection state between a plurality of FUs of the reconfigurable arrays. Therefore, an instruction mapped to each FU and the connection state between the plurality of FUs may vary depending on the configuration information stored in the configuration memory.

In addition, the configuration information may include information about a connection state between the plurality of FUs and a register file, information about a connection state between the plurality of FUs and a data memory, and information about a connection state between the plurality of FUs and an external node (not shown). The external node may store a specific constant value, wherein when the plurality of FUs require the specific constant value, the plurality of FUs may acquire the specific constant value by accessing the external node based on the configuration information.

In operation 830, each of the plurality of reconfigurable arrays may execute a task based on the received configuration information. In detail, each of the plurality of reconfigurable arrays may simultaneously execute the task by using the plurality of FUs included in each of the plurality of reconfigurable arrays, according to the received configuration information.

According to an embodiment, since the plurality of reconfigurable arrays parallel process data at the same time through the configuration information in the configurable memory, the present embodiment may be advantageous for a task of processing bulk data. For example, examples of the task of processing bulk data may be various digital image signal processing techniques by which an image device provides image quality close to a natural image. The contents about the various digital image signal processing techniques are the same as described above.

According to an embodiment, the control processor may transmit a task execution instruction to the reconfigurable processor 300 such that the reconfigurable processor 300 executes a task, but the control processor may directly execute the task by sharing some resources of the reconfigurable processor 300. According to an embodiment, the reconfigurable processor 300 may be directly coupled to the control processor to execute the task in the VLIW mode.

In addition, each of the plurality of FUs may execute a scalar-type operation and a vector-type operation. Therefore, the reconfigurable processor 300 may process a plurality of pieces of data with a same instruction.

Figure 9:
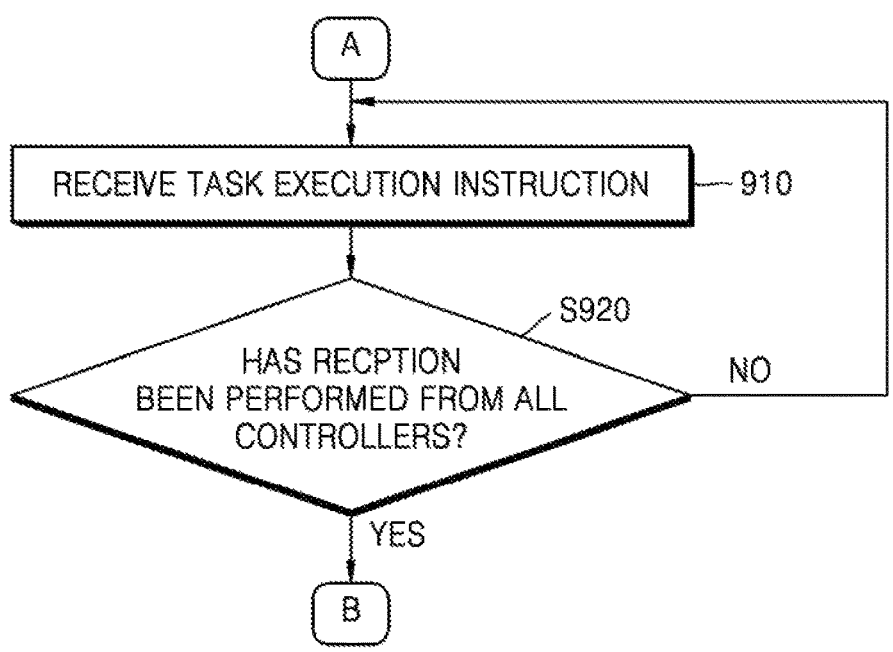
FIG. 9 is a flowchart for describing operation 810 of FIG. 8 in more detail, according to an embodiment.

FIG. 9 is a flowchart for describing operation 810 of FIG. 8 in more detail when the reconfigurable processor 300 receives task execution instructions from a plurality of controllers, according to an embodiment.

The reconfigurable processor 300 may receive a task execution instruction from a single control processor, or may receive task execution instructions from the plurality of controllers in operation 910. In this case, since all of a plurality of reconfigurable arrays included in the reconfigurable processor 300 simultaneously execute a task when configuration information in a configurable memory included in the reconfigurable processor 300 is transmitted to the plurality of reconfigurable arrays, the configurable memory can transmit the configuration information only when the configurable memory receives the task execution instructions from all of the plurality of controllers.

Therefore, in operation 920, the reconfigurable processor 300 may determine whether the task execution instructions have been received from all of the controllers. In more detail, the reconfigurable processor 300 may determine whether the configuration memory included in the reconfigurable processor 300 has received the task execution instructions from all of the controllers. According to an embodiment, this determination may be performed by a start synchronizer included in the reconfigurable processor 300, and according to another embodiment, the start synchronizer may receive the task execution instructions from all of the controllers and transmit the received task execution instructions to the configuration memory included in the reconfigurable processor 300.

According to an embodiment, when the reconfigurable processor 300 determines that the task execution instructions have been received from all of the controllers, in operation 820 of FIG. 8, the configuration memory may transmit the configuration information to the reconfigurable arrays.

According to an embodiment, when the reconfigurable processor 300 determines that the task execution instructions have not been received from all of the controllers, the reconfigurable processor 300 may wait until the task execution instructions are received from all of the controllers.

Figure 10:
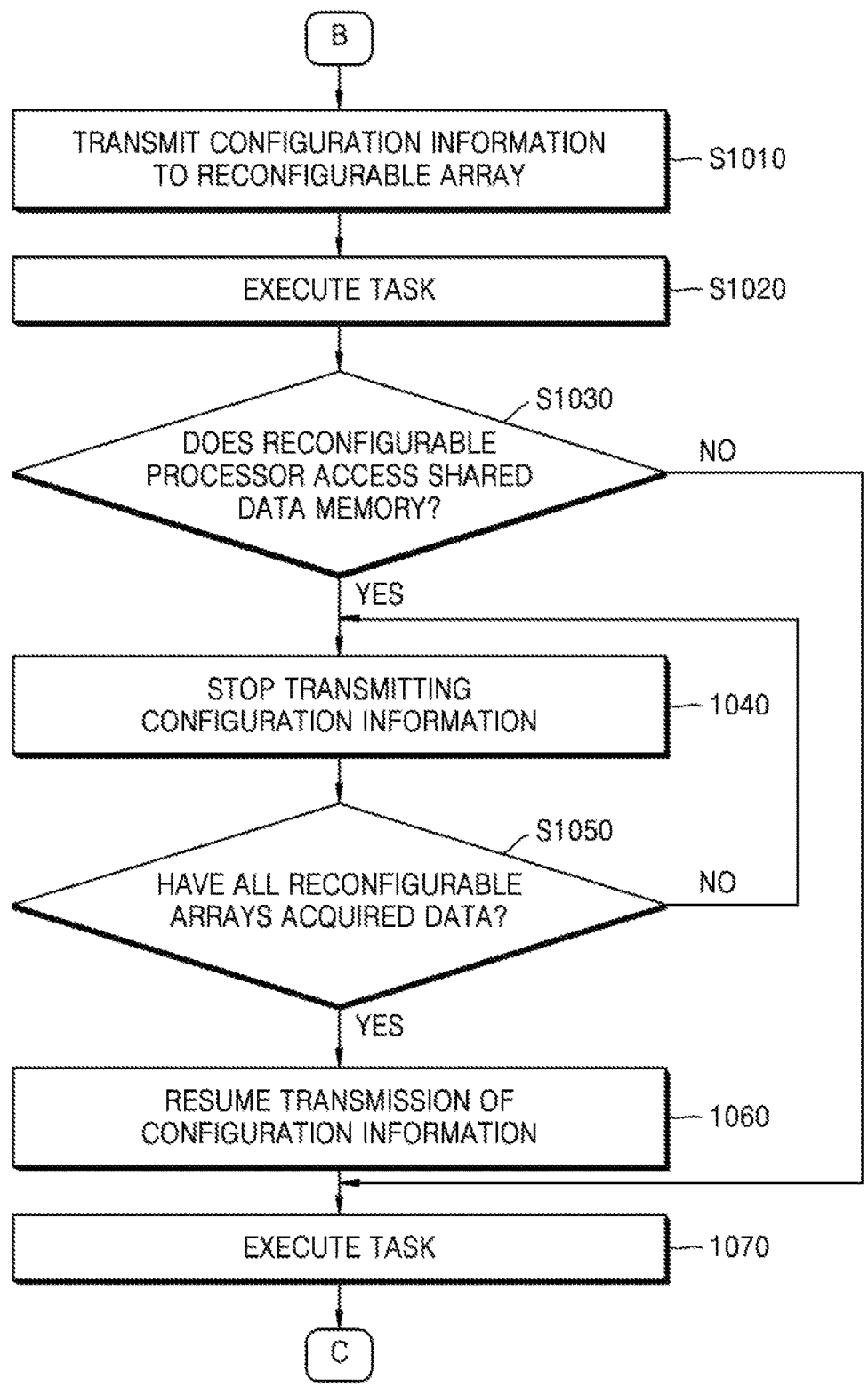
FIG. 10 is a flowchart for describing operations 820 and 830 of FIG. 8 in more detail, according to an embodiment.

FIG. 10 is a flowchart for describing operations 820 and 830 in more detail when the reconfigurable processor 300 acquires specific data from an external shared memory, according to an embodiment.

In operations 1010 and 1020, the reconfigurable processor 300 transmits configuration information in a configuration memory included in the reconfigurable processor 300 to a reconfigurable array included in the reconfigurable processor 300, and the reconfigurable array executes a task by using a plurality of FUs.

In operation 1030, the reconfigurable processor 300 may determine whether the reconfigurable processor 300 accesses a shared data memory while the reconfigurable array is executing the task. In detail, the reconfigurable processor 300 may determine whether the reconfigurable array has accessed the shared data memory to acquire specific data required for the task while executing the task.

According to an embodiment, when each of a plurality of reconfigurable arrays included in the reconfigurable processor 300 cannot acquire the specific data by simultaneously accessing the shared data memory, each of the plurality of reconfigurable arrays has to sequentially access the shared data memory to acquire the specific data.

When the reconfigurable processor 300 accesses a shared data memory in operation 1030, the reconfigurable processor 300 may stop transmitting the configuration information in the configuration memory in operation 1040. Since the plurality of reconfigurable arrays simultaneously operate according to one piece of configuration information, operations of all of the plurality of reconfigurable arrays have to be stopped until all of the plurality of reconfigurable arrays acquire the specific data by accessing the shared data memory. Therefore, to stop the transmission of the configuration information, the reconfigurable processor 300 may include an array synchronizer. According to an embodiment, the array synchronizer may generate a stop signal to stop the transmission of the configuration information until all of the plurality of reconfigurable arrays acquire the specific data by accessing the shared data memory.

In operation 1050, the reconfigurable processor 300 may determine whether all of the plurality of reconfigurable arrays have acquired the specific data by accessing the shared data memory. According to an embodiment, this determination may be performed by the array synchronizer.

When all of the plurality of reconfigurable arrays have acquired the specific data in operation 1050, the reconfigurable processor 300 may resume the transmission of the configuration information in operation 1060. According to an embodiment, this resume signal may indicate that the stop signal of the array synchronizer ends. In operation 1070, the reconfigurable processor 300 may resume the task execution through the transmission of the configuration information in the configuration memory.

When the reconfigurable processor 300 does not access the shared data memory in operation 1030, the reconfigurable processor 300 may continuously execute the task in operation 1070.

The above-described method of operating a reconfigurable processor can be written as computer-executable programs and can be implemented in general-use digital computers that execute the programs using a computer-readable recording medium. Examples of the computer-readable recording medium include storage media such as magnetic storage media (e.g., ROM, floppy disks, hard disks, etc.) and optical recording media (e.g., CD-ROMs, or DVDs).

While this invention has been particularly shown and described with reference to embodiments thereof, it will be understood by those skilled in the art to which the embodiments belong that various changes in form and details may be made therein without departing from the essential properties. Therefore, the embodiments should be considered in descriptive sense only and not for purposes of limitation. The scope of the invention according to the embodiments is defined not by the description described above but by the claims, and all differences within the equivalent scope will be construed as being included in the scope of the invention.

The invention claimed is:

1. A reconfigurable processor comprising:
    a configurable memory configured to receive a task execution instruction from a control processor;
    a first reconfigurable array that includes a first set of function units configured to receive configuration information from the configurable memory based on the received task execution instruction;
    a second reconfigurable array that includes a second set of function units configured to receive the configuration information from the configurable memory based on the received task execution instruction; and
    an array synchronizer configured to transmit, to the configurable memory, a signal for stopping transmission of the configuration information until the first reconfigurable array and the second reconfigurable array acquire data from an external shared data memory,
    wherein the first reconfigurable array executes a task, based on the configuration information, by using the first set of function units in a period of time, and wherein the second reconfigurable array executes the task, based on the configuration information, by using the second set of function units in the period of time.

2. The reconfigurable processor of claim 1, wherein the control processor comprises a plurality of controllers, and the reconfigurable processor further comprises a start synchronizer configured to determine whether the configurable memory has received all of a plurality of task execution instructions respectively from the plurality of controllers.

3. The reconfigurable processor of claim 2, wherein if the configurable memory has received all of the plurality of task execution instructions as a result of the determination, the configuration information is transmitted to each of the first reconfigurable array and the second reconfigurable array.

4. The reconfigurable processor of claim 1, wherein the array synchronizer is further configured to stop transmitting the configuration information to each of the first reconfigurable array and the second reconfigurable array until the first reconfigurable array and the second reconfigurable array acquire specific data, when each of the first reconfigurable array and the second reconfigurable array accesses the external shared data memory to acquire the specific data.

5. The reconfigurable processor of claim 4, wherein the array synchronizer resumes the transmission of the configuration information when the first reconfigurable array and the second reconfigurable array have acquired the specific data.

6. The reconfigurable processor of claim 1, wherein each of the first reconfigurable array and the second reconfigurable array is a coarse grained array (CGA) configured by connecting a plurality of function units to each other.

7. The reconfigurable processor of claim 1, wherein the configuration information includes information for reconfiguring the first set of function units or the second set of function units.

8. The reconfigurable processor of claim 7, wherein each of the first reconfigurable array and the second reconfigurable array comprises a register file, and
the information for the reconfiguration includes information about a connection configuration between a plurality of function units that is included in each of the first set of function units or the second set of function units, information about a connection configuration between any one of the first set of function units or the second set of function units and the register file, and information about a connection configuration between any one of the first set of function units or the second set of function units and an external shared resource.

9. The reconfigurable processor of claim 1, wherein each of the first set of function units or the second set of function units executes a scalar operation or a vector operation.

10. The reconfigurable processor of claim 1, wherein the control processor executes the task by directly controlling a resource included in any one of the first reconfigurable array and the second reconfigurable array.

11. A method of operating a reconfigurable processor, the method comprising:
receiving, by a configurable memory included in the reconfigurable processor, a task execution instruction from a control processor;
receiving, by a first reconfigurable array that includes a first set of function units, configuration information from the configurable memory based on the received task execution instruction;
receiving, by a second reconfigurable array that includes a second set of function units, the configuration information from the configurable memory based on the received task execution instruction; and
transmitting, to the configurable memory, a signal for stopping transmission of the configuration information until the first reconfigurable array and the second reconfigurable array acquire data from an external shared data memory,
wherein the first reconfigurable array executes a task, based on the configuration information, by using the first set of function units in a period of time, and
wherein the second reconfigurable array executes the task, based on the configuration information, by using the second set of function units in the period of time.

12. The method of claim 11, wherein the control processor comprises a plurality of controllers, and
the receiving by a configurable memory comprises respectively receiving a plurality of task execution instructions from the plurality of controllers.

13. The method of claim 12, wherein if the configurable memory has received all of the plurality of task execution instructions,
wherein the configuration information is transmitted to each of the first reconfigurable array and the second reconfigurable array.

14. The method of claim 11, further comprising:
accessing, by each of the first reconfigurable array and the second reconfigurable array, an external shared data memory to acquire specific data.

15. A computer-readable recording medium has recorded thereon a program for executing the method of claim 11 in a computer.

* * * * *